US006507116B1

(12) United States Patent
Caletka et al.

(10) Patent No.: US 6,507,116 B1
(45) Date of Patent: Jan. 14, 2003

(54) ELECTRONIC PACKAGE AND METHOD OF FORMING

(75) Inventors: David V. Caletka, Apalachin, NY (US); Eric A. Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,075

(22) Filed: Oct. 29, 1999

Related U.S. Application Data

(63) Continuation-in-part of application No. 09/080,117, filed on May 15, 1998, now Pat. No. 6,104,093, which is a continuation-in-part of application No. 08/842,417, filed on Apr. 24, 1997, now Pat. No. 5,883,430.

(51) Int. Cl.[7] ............................................. H01C 28/48
(52) U.S. Cl. .................... 257/778; 257/678; 257/701
(58) Field of Search ...................... 257/628, 701–717, 257/778

(56) References Cited

U.S. PATENT DOCUMENTS

| 4,151,547 A | | 4/1979 | Rhoades et al. ............... 357/81 |
| 5,041,902 A | * | 8/1991 | McShane ..................... 357/79 |
| 5,111,359 A | | 5/1992 | Montesano ................. 361/388 |
| 5,247,426 A | | 9/1993 | Hamburgen et al. ........ 371/705 |
| 5,537,342 A | | 7/1996 | Gainey ........................ 361/705 |
| 5,619,070 A | | 4/1997 | Kozono ....................... 257/692 |
| 5,625,226 A | | 4/1997 | Kinzer ........................ 257/705 |
| 5,705,851 A | * | 1/1998 | Mostafazadeh et al. ..... 257/675 |
| 5,726,079 A | | 3/1998 | Johnson ....................... 438/106 |
| 5,736,785 A | | 4/1998 | Chiang et al. .............. 257/712 |
| 5,760,465 A | | 6/1998 | Alcoe et al. ................. 257/669 |
| 5,777,847 A | | 7/1998 | Tokuno et al. .............. 361/705 |
| 5,868,887 A | | 2/1999 | Sylvester et al. ........... 156/150 |
| 5,883,430 A | | 3/1999 | Johnson ....................... 257/706 |

FOREIGN PATENT DOCUMENTS

JP            05275580 A   * 10/1993

OTHER PUBLICATIONS

"High Performance Carrier Technology", Materials and Fabrication, by Light et al, 1993 International Electronics Packaging Conference, San Diego, California, Volume One.
"High Performance Carrier Technology", by Heck et al, 1993 International Electronics Packaging Conference, San Diego, California, Volume One.
"Process Considerations in the Fabrication of Teflon Printed Circuit Boards", by Light et al, 1994 Proceedings, 44 Electronic Components & Technology Conference, 5/94.

* cited by examiner

*Primary Examiner*—Nathan J. Flynn
*Assistant Examiner*—Leonardo Andujar
(74) *Attorney, Agent, or Firm*—Laurence R. Fraley; Steven Fischman (57) ABSTRACT

An electronic package and method of making same in which a thermally conductive member is in thermally conductive communication with a semiconductor chip encapsulated within a dielectric material that surrounds portions of a thermally conductive member, semiconductor chip, and a predefined portion of a circuitized substrate. The present invention's thermally conductive member includes two portions of different bending stiffness to assure reduced interfacial stresses between the semiconductor chip and the circuitized substrate.

8 Claims, 10 Drawing Sheets

Fig. 10

ELECTRONIC PACKAGE AND METHOD OF FORMING

CROSS REFERENCE TO COPENDING APPLICATION

This application is a continuation in part of Ser. No. 09/080,117, now U.S. Pat. No. 6,104,093 filed May 15, 1998, which is a continuation in part of Ser. No. 08/842,417, filed Apr. 24, 1997, now issued patent U.S. Pat. No. 5,883,430.

TECHNICAL FIELD

This invention relates generally to encapsulated semiconductor chips and more particularly to a semiconductor chip package, an electronic package, such as a flip chip package, having a thermally conductive member encapsulated with the semiconductor chip.

BACKGROUND OF THE INVENTION

A flip chip is a small semiconductor chip (chip) having terminations all on one side in the form of solder pads or bump contacts. Typically, the surface of the chip has been passivated or otherwise treated. The flip chip derives its name from the practice of flipping, or turning, the chip over after manufacture, prior to attaching the chip to a matching substrate.

Electronic packages, which include chips (including flip chips), usually require a cover, cap, or encapsulant of some type over the chip to protect it, and to provide a large flat surface for pick-and-place operations. However, any cover, cap, or encapsulant above the chip increases the thermal resistance path to an ambient environment and, hence, the operational temperature of the chip.

Various means have been used to mitigate the effects of such covers or caps. One approach has been to use a capped chip with a thin layer of a thermally conductive grease between the chip and the cap. However, it has been found that during thermal cycling, the grease has a tendency to be pumped, or displaced from the interface between the chip and the cap, thus increasing the thermal resistance of the interface. Pumping, or grease pumping as it is commonly referred, results as the gap between the chip and the cap increases and decreases, eventually forcing enough grease out of the gap, and forming a critical number of voids, to hinder thermal performance. This change in the gap thickness results as the substrate, to which the chip and cap are attached, and the cap bend to differing radii of curvature, due to the coefficient of thermal expansion (CTE) mismatch of the cap and substrate under thermomechanical loads. The stiff (nearly solid) nature of the grease contributes to the formation and coalescence of voids under this pumping action. A critical magnitude of tensile/compressive grease strain exists which results in maximum allowed thermal degradation. Another approach has been to attach a cap to the chip with an adhesive. This presents an opportunity to "balance" the package by matching the expansion and stiffness of the cap to that of the substrate so that the electronic package remains nearly flat at all temperatures. This approach is not, however, without problems. The CTE mismatch between the chip and the cap produces interfacial stresses between the adhesive and both the surface of the cap and the top surface of the chip. These stresses can cause delamination during the manufacturing process or during thermal cycling (chip operation in the field) near the corners and edges of the chip. Once delamination begins, crack propagation may ultimately lead to a defective product and/or electrical failure in the field. This is a major problem with capped chips particularly with flip chips on circuitized substrates of the organic type, such as epoxy laminate types.

The present invention is directed at overcoming the problems set forth above. It is desirable to have an electronic package and method to make the package that provides low thermal resistance, minimizes interfacial stresses, and is economical to manufacture. It is also desirable to have such an electronic package and method of manufacture that uses conventional assembly techniques. It is further desirable to have such an electronic package that does not require the presence of a thermally conductive grease between the chip and a thermally conducting member such as a cover or cap. Electronic packages produced by the method of this invention will have superior thermal performance and have much improved operational field life.

SUMMARY OF THE INVENTION

Accordingly, it is an object of this invention to enhance the art of packaging technology.

It is another object of this invention to provide a novel method for producing an electronic package that utilizes conventional assembly techniques to economically mass produce the package.

It is yet another object of this invention to provide an electronic package that minimizes interfacial stresses between the adhesive and both the chip and a cover or cap over the chip and results in much improved operational field life.

Still another object of this invention is to provide an electronic package that does not require the presence or use of thermal grease and has superior thermal performance.

According to one aspect of this invention, there is provided an electronic package, comprising a circuitized substrate having an upper surface, a semiconductor chip mounted on the upper surface of the circuitized substrate and electrically coupled to the substrate, the semiconductor chip having a substantially planar upper surface and at least one edge surface being substantially perpendicular to the substantially planar upper surface, the planar upper surface of the semiconductor chip having a defined area thereon. The electronic package further includes a thermally conductive member having upper and lower surfaces, the lower surface of the thermally conductive member being thermally coupled to the substantially planar upper surface of the semiconductor chip, the thermally conductive member further including at least one edge surface extending around a defined perimeter of the thermally conductive member. The thermally conductive member includes a body portion and a projecting portion, the body portion located substantially directly over the defined area of the planar upper surface of the semiconductor chip and having a bending stiffness greater than the bending stiffness of the projecting portion. The electronic package also includes a substantially rigid dielectric material positioned on at least a portion of the upper surface of the circuitized substrate and against at least a portion of the at least one edge surface of the thermally conductive member and against at least a portion of the at least one edge surface of the semiconductor chip.

According to another aspect of this invention, there is provided a method of making an electronic package comprising the steps of providing a circuitized substrate having an upper surface, mounting a semiconductor chip on the upper surface of the circuitized substrate, and electrically coupling the semiconductor chip to the circuitized substrate.

The semiconductor chip has a substantially planar upper surface and at least one edge surface substantially perpendicular to the substantially planar upper surface, the planar upper surface of the semiconductor chip having a defined area thereon. A thermally conductive member is provided having upper and lower surfaces, at least one edge surface extending around a defined perimeter of the thermally conductive member, and further including a body portion and a projecting portion. The body portion of the thermally conductive member is positioned substantially directly over and in thermal communication with the defined area of the planar upper surface of the semiconductor chip, the body portion having a bending stiffness greater than the bending stiffness of the projecting portion. A dielectric material is also positioned on at least a portion of the upper surface of the circuitized substrate and against at least a portion of the at least one edge surface of the thermally conductive member and against at least a portion of the at least one edge surface of the semiconductor chip.

According to yet another aspect of the invention, there is provided a heat sink member comprising a body portion with a first bending stiffness and a first thickness, the body portion occupying a plane, and a projecting portion with a second bending stiffness and a second thickness, the projecting portion projecting from the body portion substantially within the plane, the body portion adapted for being thermally coupled to a defined planar area of a semiconductor chip, the first bending stiffness of the body portion being greater than the second bending stiffness of the projecting portion and the first thickness of said body portion being greater than the second thickness of the projecting portion.

The above objects, advantages, and features of the present invention will become more readily apparent from the following detailed description of the presently preferred embodiment as illustrated in the accompanying drawings.

BEST MODE FOR CARRYING OUT THE INVENTION

Figure 1:
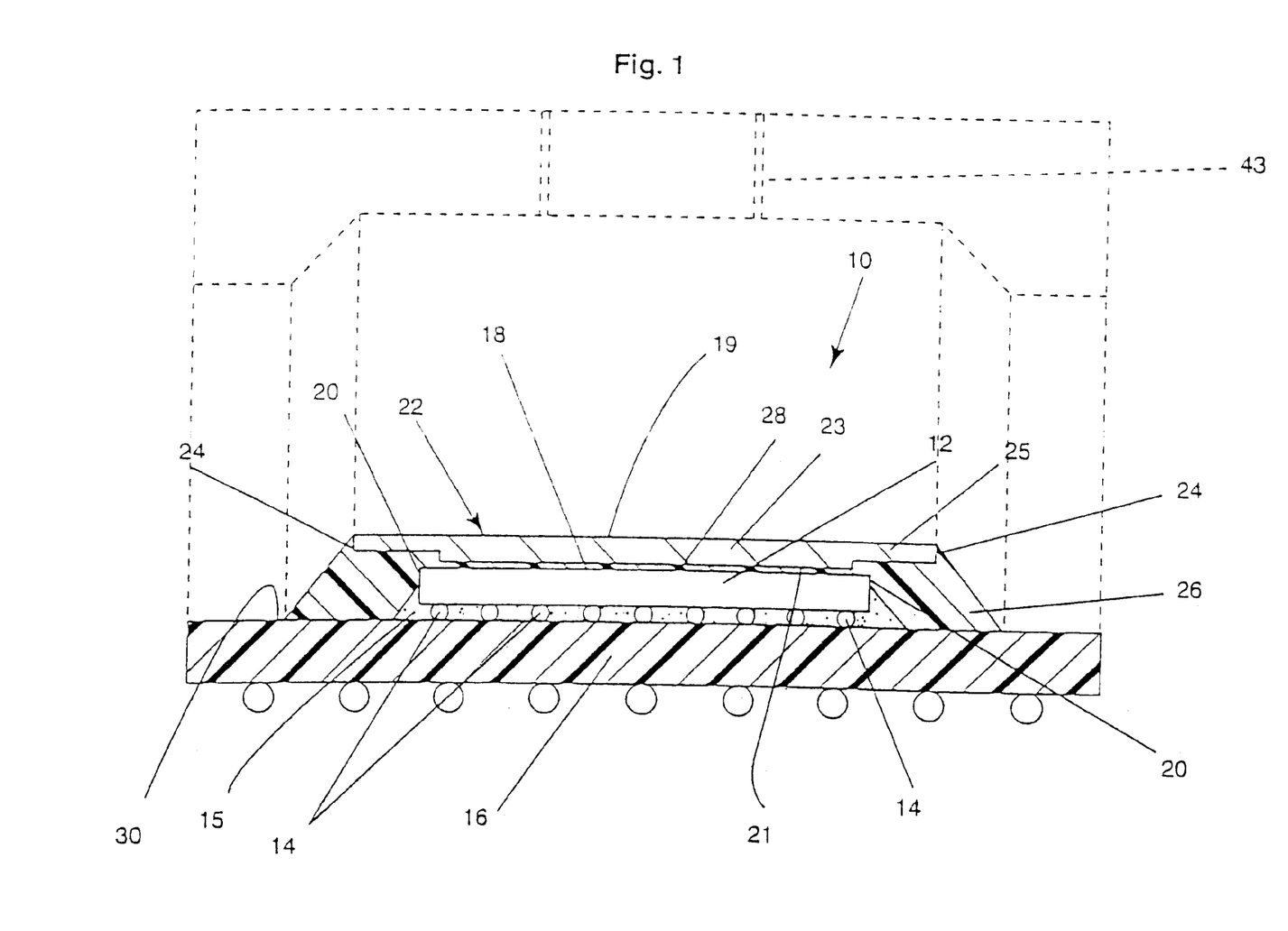
FIG. 1 is a sectional view in elevation of one embodiment of the electronic package of the present invention, illustrating the assembled semiconductor chip, circuitized substrate, and the thermally conductive member of the electronic package. A mold cavity used in assembly of the electronic package is shown in phantom.

An electronic package 10 embodying the present invention, is shown in FIG. 1. The electronic package includes a chip 12, (e.g., a flip chip), that has a plurality of electrical contacts 14 (e.g., solder balls) that are electrically connected to corresponding contacts associated with one or more electrical circuits disposed on a circuitized substrate 16. If desired, an underfill material 15 such as Dexter Hysol™4511 epoxy, made by Dexter Electronic Materials, Industry, CA., may be used to prolong fatigue life of electrical contacts 14. Other commercially available underfill materials that can be used are available from Dexter Electronic Materials as Dexter Hysol™4527 or from Namics Corporation, Niigata City, Japan, under the product name Namics 8437-2. The circuitized substrate 16 is a circuit board having a number of electrical circuits defined on and within the substrate and is adapted for interconnection with other components of an electronic assembly. The circuit board can be made of a laminted epoxy material, a liquid crystal polymer, polytetrafluoroethylene, or any other suitable organic material. The chip 12 has a planar upper surface 18, with a defined area thereon, that can be spaced from substrate 16 by a predefined distance, and at least one edge surface 20 that extends around a defined perimeter of the planar upper surface and is disposed in substantially perpendicular relationship with the planar upper surface.

Importantly, the electronic package 10 embodying the present invention includes a thermally conductive member (or heat sink) 22, typically a cover or cap, having an upper surface 19 and lower surface 21, that is thermally coupled to the planar upper surface 18 of chip 12. The thermally conductive member 22 has at least one edge surface 24 that extends around a defined perimeter of the thermally conductive member. The thermally conductive member 22 may comprise a material selected from the group consisting of copper, beryllium copper, copper alloys, steel, other steel alloys, aluminum, aluminum alloys, ceramics, silicon, sintered metal, and sintered metal/ceramic materials or combinations thereof.

The thermally conductive member 22 includes a body portion 23 and a projecting portion 25. The body portion is located directly over the defined area of the planar upper surface of the chip. The defined area of the planar upper surface 18 may cover about the entirety of the planar upper surface, or, alternatively, about less than (a preferred amount being about 90%) the entirety of the planar upper surface.

The electronic package embodying the present invention also includes a substantially rigid dielectric material 26, such as Masterbond Supreme 10AOHT thermoset plastic, or any of the many mold compounds in wide use today, positioned against at least a portion of the one edge surface 24 of thermally conductive member 22, at least a portion of the edge surface 20 of chip 12, and at least a portion of circuitized substrate 16. The dielectric material 26 in FIG. 1 effectively encapsulates chip 12, and the portion of thermally conductive member 22 and the portion of the circuitized substrate 16 without covering the exposed upper surface 19 of the thermally conductive member 22. Preferably, the substantially rigid dielectric material 26 fills a space between the planar upper surface 18 of the chip 12 and the lower surface 21 of the thermally conductive member 22, thermally coupling the lower surface of the thermally conductive member to the upper surface of the chip. The substantially rigid dielectric material 26 may also be utilized as the underfill material 15, eliminating the need for an underfill of a composition different from that of the substantially rigid dielectric material.

Figure 2:
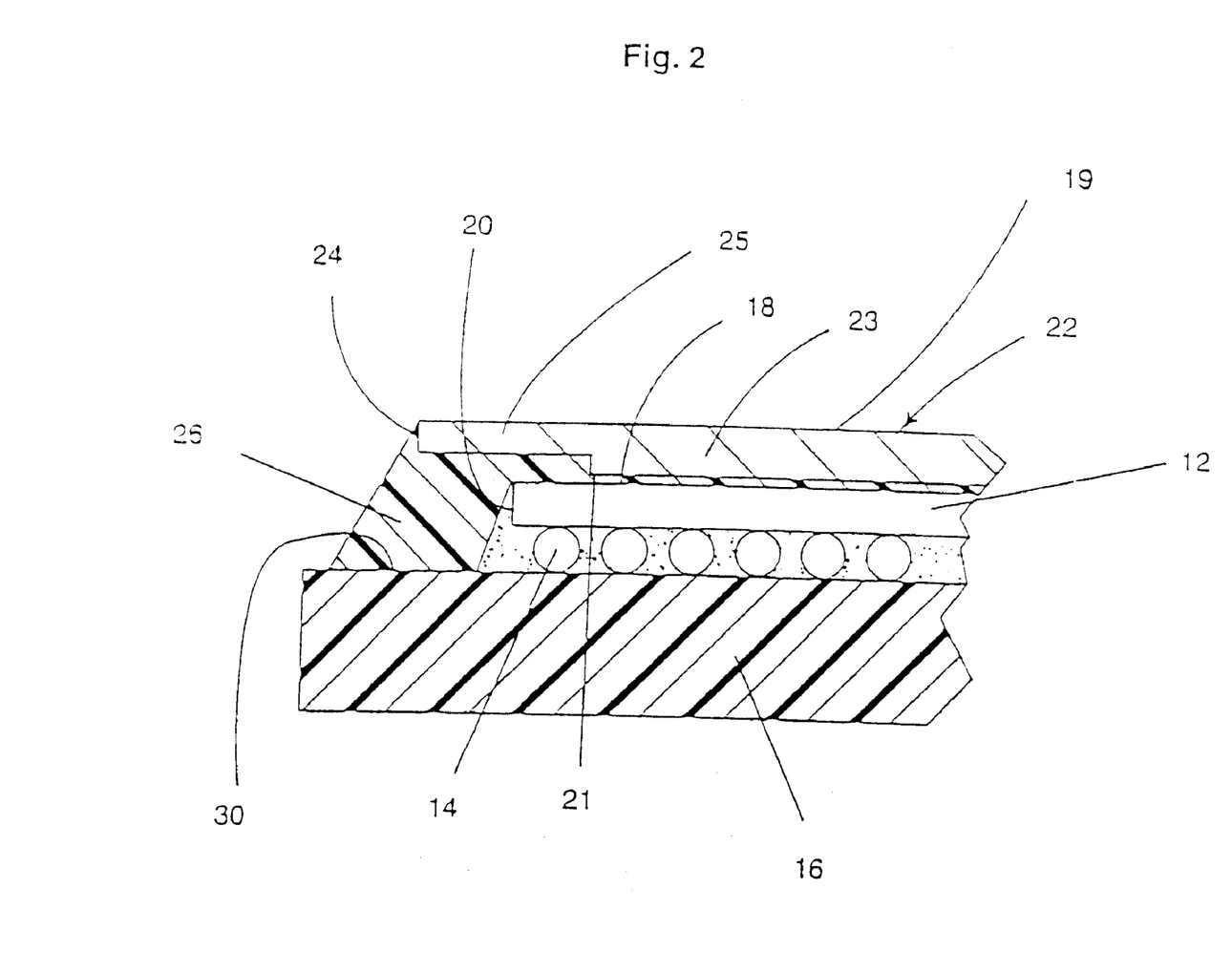
FIG. 2 is a slightly enlarged view of a portion of FIG. 1, more closely illustrating the body portion and projecting portion.

FIG. 2 is an enlarged view of a portion of FIG. 1 illustrating thermally conductive member 22, including body portion 23 and projecting portion 25 that substantially surrounds the body portion of the thermally conductive member. Body portion 23 is thicker than the projecting portion 25. The body portion 23 is designed to have expansion and stiffness characteristics to balance the expansion and stiffness characteristics of the substrate 16 while the projecting portion 25 is chosen to be as thin as possible. Preferably, the body portion 23 has a thickness about 1.5 to about 5 times the thickness of the projecting portion 25. The body portion 23 is located directly over the defined area of planar upper surface 18 of chip 12. To substantially balance the CTE mismatch between the circuitized substrate 16 and chip 12, without delaminationg from or fracturing the chip, it is important that the thermally conductive member 22 not only cover the planar upper surface 18 of the chip, but extend beyond the at least one edge surface 20 of the chip 12 and be attached to the upper surface 30 of the circuitized substrate 16 by substantially rigid dielectric material 26. If the at least one edge surface 24 of the thermally conductive member 22 is coincident with, or very close to, edge 20 of chip 12, the interfacial stresses on the thermally conductive member 22 can be very high and delamination can occur in the substantially rigid dielectric material 26 around the periphery of the chip and propagate toward the center of the chip. It has also been found that the interfacial stresses are related to the bending stiffness of the thermally conductive member 22 near the at least one edge 20 of chip 12 and to the distance between the upper surface 18 of chip 12 and the lower surface 21 of the thermally conductive member adjacent to the projecting portion 25. In order to maintain balance around chip 12 and simultaneously reduce interfacial stresses, the bending stiffness of the thermally conductive member 22 can be reduced in the region of the chip edge 20. In this embodiment of the present invention, the reduced bending stiffness of the thermally conductive member 22 in the region of the chip edge 20 is accomplished by designing the projecting portion 25 of the thermally conductive member to be thinner than the body portion 23 of the thermally conductive member. This also increases the thickness of the substantially rigid dielectric material 26 along the edges of the chip 12, further reducing interfacial stresses. In the preferred embodiment, the top surface of the projecting portion 25 is coplanar with the upper surface 19 of the thermally conductive member 22.

Figure 3:
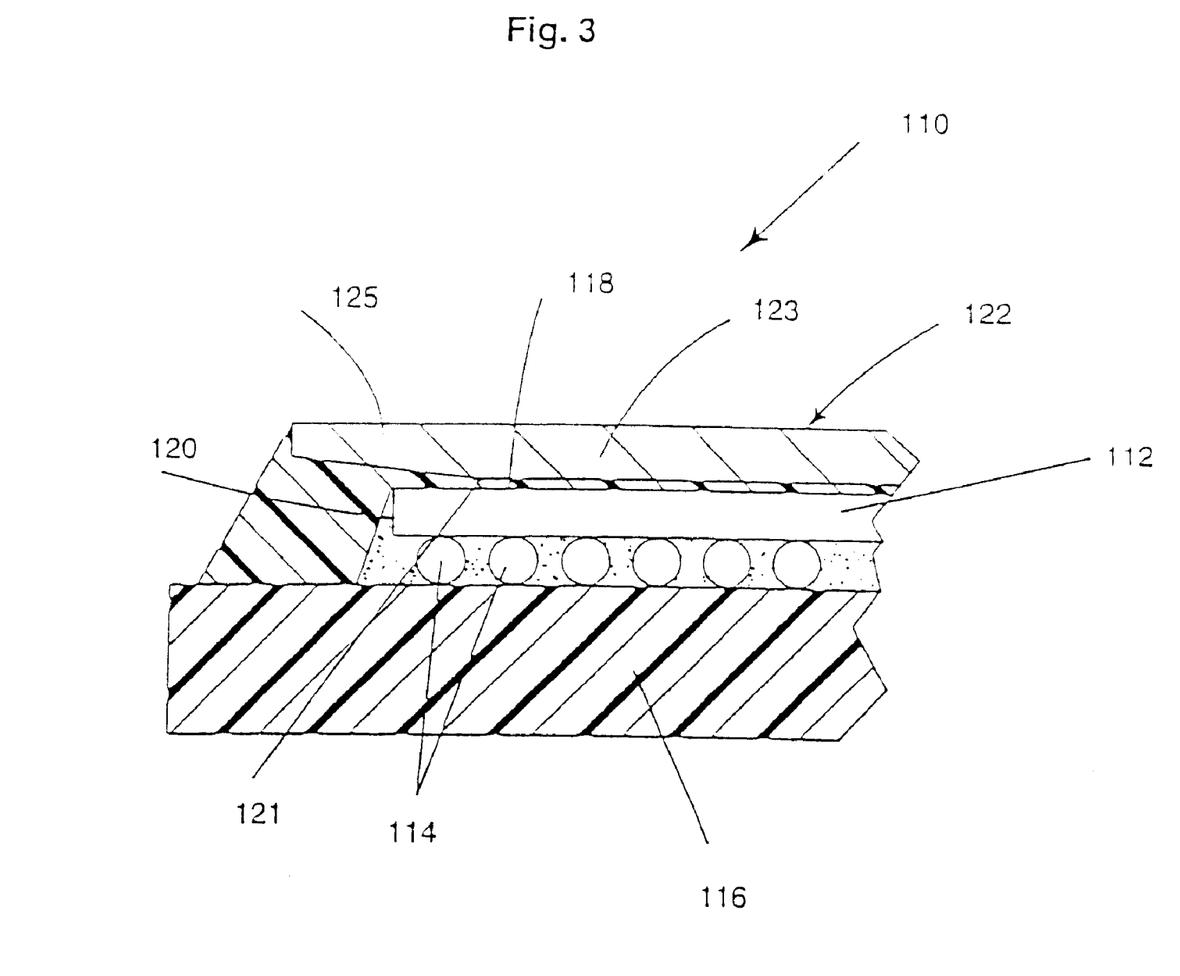
FIG. 3 is a partial sectional view, in elevation, of another embodiment of the electronic package of the present invention, illustrating the body portion of the thermally conductive member with a first thickness and the projecting portion of the thermally conductive member with a second variable thickness.

FIG. 3 illustrates another embodiment of an electronic package 110 of the present invention, where the bending stiffness of the thermally conductive member 122 can be reduced in the region of the edge 120 of the chip 112. The thermally conductive member 122 includes a body portion 123 with a first thickness and a projecting portion 125 with a variable second thickness. The variable thickness of the projecting portion reduces the bending stiffness of the thermally conductive member 122 and increases the distance between the upper surface 118 of chip 112 and the lower surface 121 of the thermally conductive member adjacent to the projecting portion 125.

Figure 4:
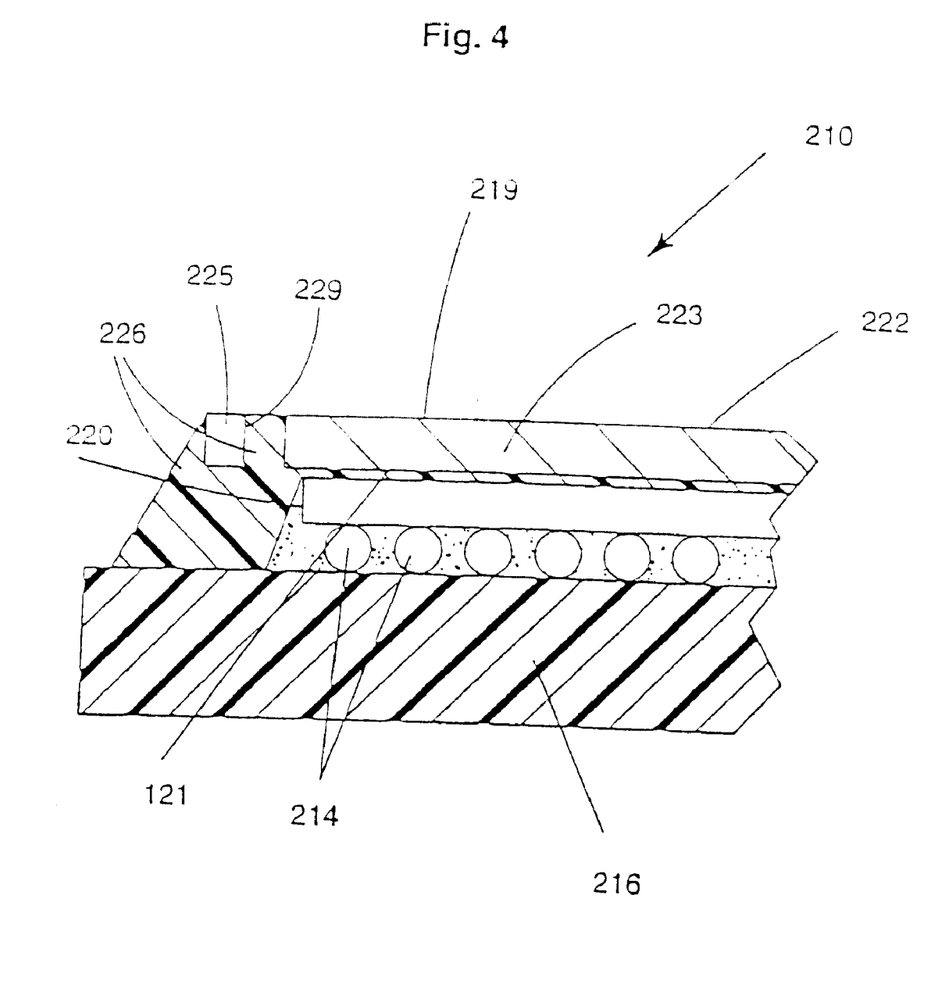
FIG. 4 is a partial sectional view, in elevation, of yet another embodiment of the electronic package of the present invention, illustrating the projecting portion of the thermally conductive member having a first plurality of openings.

FIG. 4 illustrates yet another embodiment of an electronic package 210 of the present invention wherein the projecting portion 225 of the thermally conductive member 222 includes at least one opening 229. Preferably, many such openings are provided. When circular openings are used the open area of the upper surface 219 of the projecting portion 225 of the thermally conductive member 222 can be up to 78% of the total area of the upper surface of the projecting portion. The invention is not limited to circular shaped openings. Many other shaped openings, for example, diamond or hexagonal shapes, can be also used. These openings can be substantially filled with substantially rigid dielectric material 226 to assist in anchoring the thermally conductive member to the circuitized substrate 216. The filled holes also serve to stop any propagating crack that may initiate at either the thermally conductive member-dielectric material or chip to dielectric material interface.

Figure 5A:
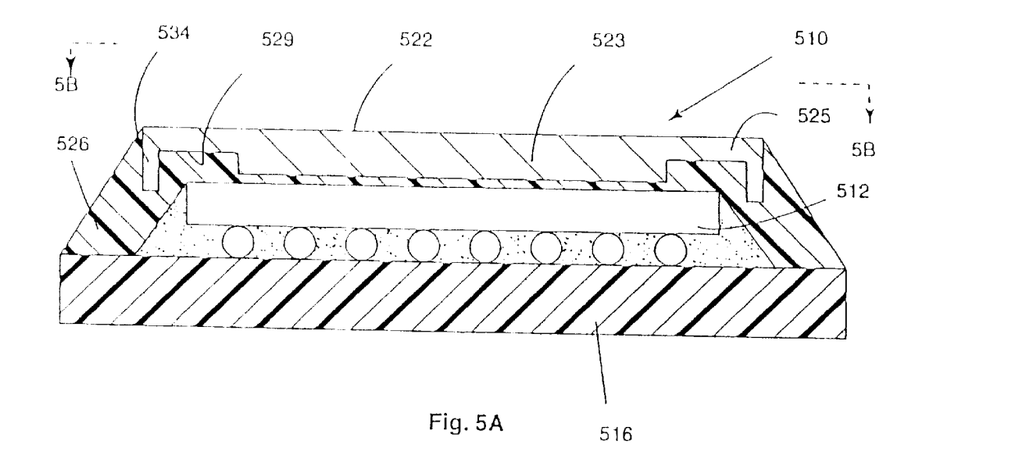
FIG. 5A is a sectional view, in elevation, of another embodiment of the electronic package of the present invention.
Figure 5B:
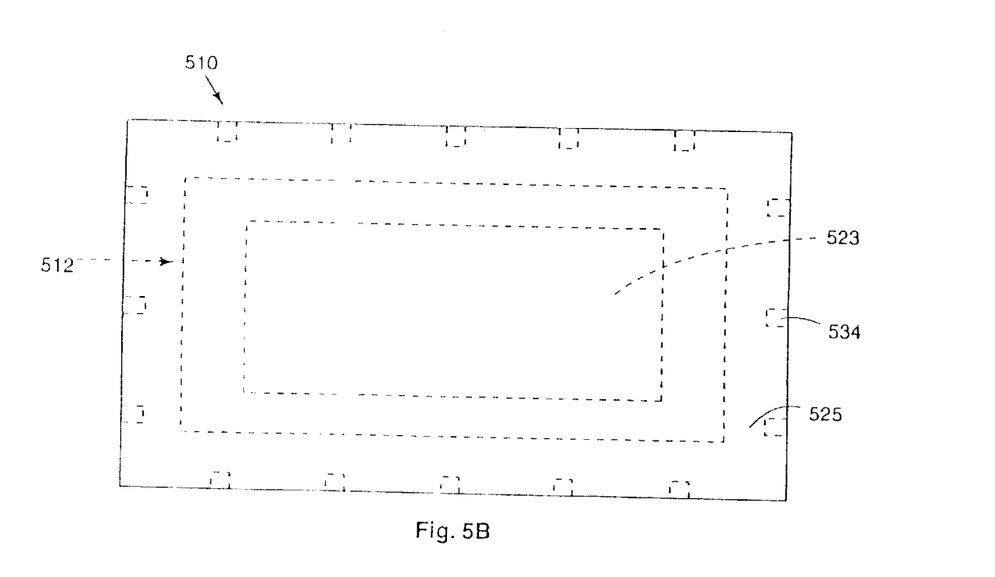
FIG. 5B is a top, plan view as taken along the line 5B—5B in FIG. 5A, illustrating the shape of the body portion of the thermally conductive member as being substantially rectangular, and the shape of the projecting portion of the thermally conductive member having flanged portions extending downward (the underlying substrate and dielectric material are not shown in this view.).

FIGS. 5A and 5B illustrate another embodiment of an electronic package 510 of the present invention where the projecting portion 525 includes a flange portion 534 extending downward from the projecting portion and positioned substantially in the substantially rigid dielectric material 526. Recess 529 (the open area between part of projecting portion 525 and corresponding upper surface of chip 512) can be substantially filled with substantially rigid dielectric material 526. A plurality of recesses can be provided, preferably at least one recess is provided. The advantage of using a flanged portion 534, positioned in the substantially rigid dielectric material 526 and using a filled recess 529, having an elongated length of rigid dielectric material contained therein, in combination with a projecting portion 525 having a reduced thickness (reduced bending stiffness) is that in addition to reduced interfacial stresses, any interfacial delaminations that initiate between the substantially rigid dielectric material and the thermally conductive member 522 can be redirected by the flange and/or recess in the thermally conductive member. The substantially rigid dielectric material 526 in recess 529 helps attach thermally conductive member 522 to the circuitized substrate 516 and to chip 512. If delamination begins and is advancing as a crack along an interface and reaches flange portion 534, the substantially rigid dielectric material 526 that fills the corresponding recess 529 requires that the delaminating crack must propagate through the substantially rigid dielectric material.

Figure 6A:
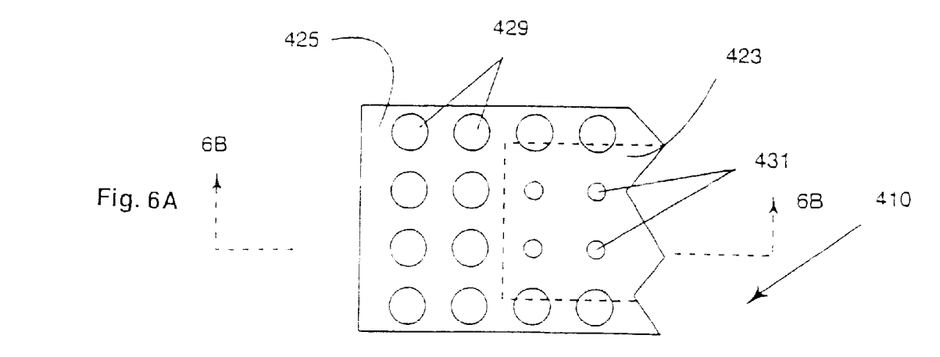
FIG. 6A is a partial, top view of still yet another embodiment of the electronic package of the present invention, illustrating the thermally conductive member having a first plurality of openings with a first cross-sectional area and a second plurality of openings with a second cross-sectional area therein.
Figure 6B:
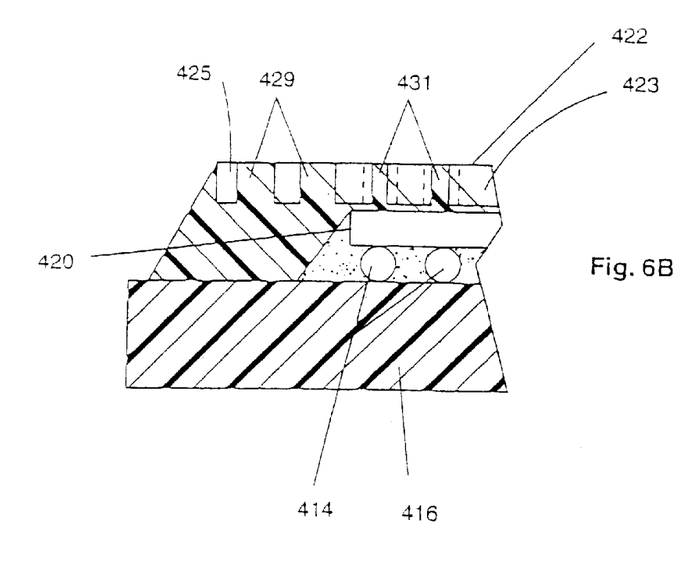
FIG. 6B is a partial sectional view, in elevation, as taken along the line 6B—6B in FIG. 6A.

FIGS. 6A and 6B illustrate still yet another embodiment of the electronic package 410 of the present invention where the projecting portion 425 includes a first plurality of openings 429 and the body portion 423 includes a second plurality of openings 431, wherein each of the first plurality of openings 429 include a first cross sectional area and each of said second plurality of openings 431 include a second cross sectional area, the first cross sectional area of each of the first plurality of openings 429 being greater than the second cross sectional area of each of the second plurality of openings 431. In one embodiment, larger openings 429 were used with smaller openings 431. The spacing and number of openings 429 may be varied in projecting portion 425 and body portion 423 so that the total percent open area in the projecting portion is greater than the total percent open area in the body portion and the bending stiffness in the two portions differs by preferably greater than about 50%. Even though FIGS. 6A and 6B illustrate the electronic package 410 of the present invention as including only openings in the thermally conductive member (as in FIG. 5), recesses may also be included, in combination with a corresponding number of such openings, as long as the required reduction in bending stiffness is achieved near chip edge 420.

Figure 7:
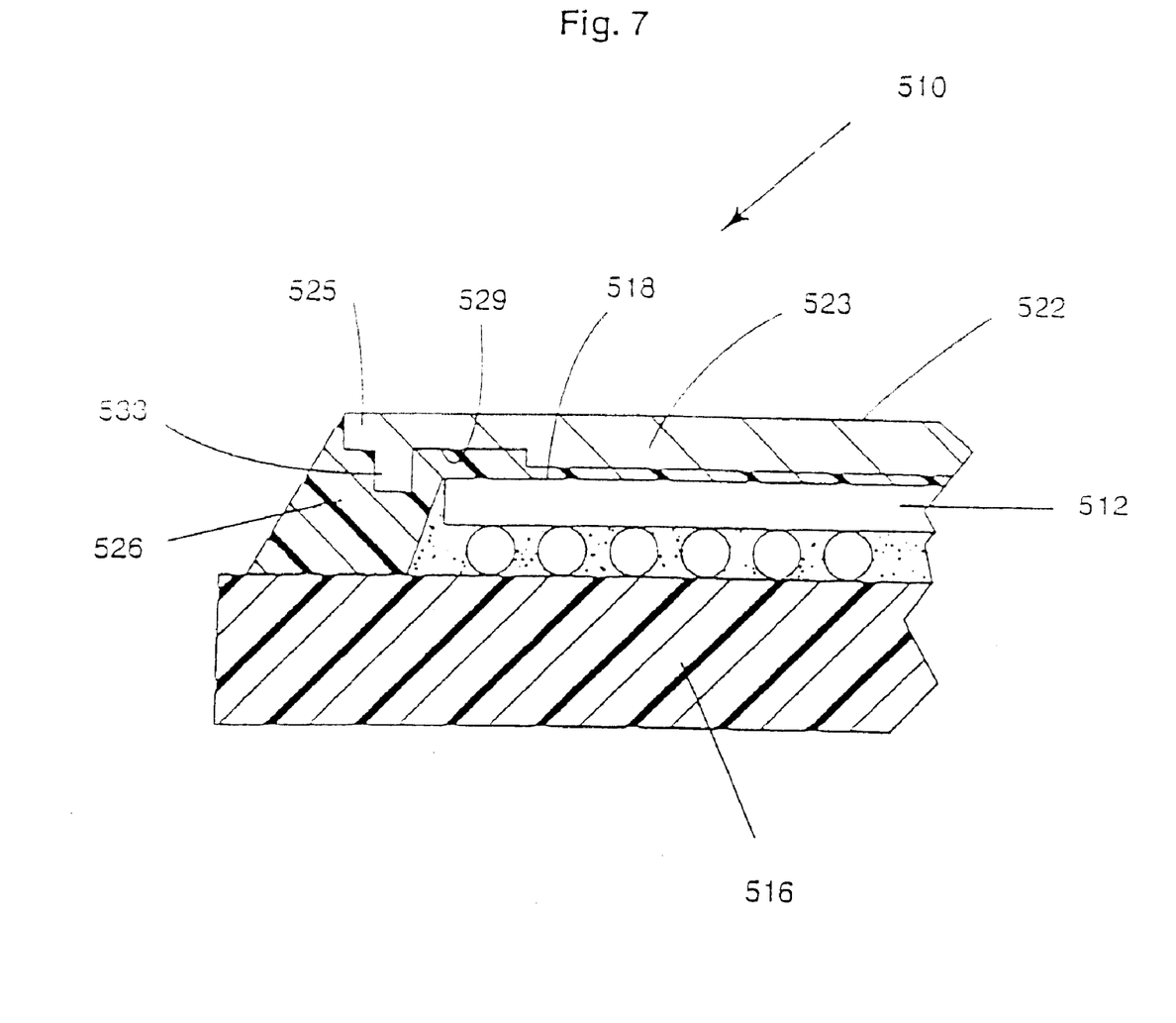
FIG. 7 is a partial sectional view, in elevation, of still another embodiment of the electronic package of the present invention, illustrating the projecting portion of the thermally conductive member having a pin portion extending from the projecting portion.

FIG. 7 illustrates still another embodiment of an electronic package 510 of the present invention where the projecting portion 525 includes pin portion 533 extending from the projecting portion and positioned substantially in the substantially rigid dielectric material 526. A plurality of such pin portions are provided, minimally at least one per side of the thermally conductive member 522 can be used. Each pin portion 533 is preferably substantially rectangular in shape, but other shapes are also possible. Recess 529 (the open area between part of projecting portion 525 and corresponding upper surface 518 of chip 512) can be substantially filled with substantially rigid dielectric material 526. A plurality of recesses are possible, preferably at least one is provided. The advantage of using a plurality of pin portions 533, positioned in the substantially rigid dielectric material 526 and using a plurality of filled recesses (or holes) 529 in combination with a projecting portion 525 having a reduced thickness (reduced bending stiffness) is that in addition to reduced interfacial stresses, any interfacial delaminations that initiate between the substantially rigid dielectric material and the thermally conductive member 522 can be redirected by the pin portions and/or recesses in the thermally conductive member. The substantially rigid dielectric material 526 in recess 529 helps attach thermally conductive member 522 to the circuitized substrate 516 and to chip 512. If delamination begins and is advancing as a crack along an interface and reaches pin portion 533, the substantially rigid dielectric material 526 that fills the corresponding recess 529 requires that the delaminating crack must propagate through the substantially rigid dielectric material. The substantially rigid dielectric material 526 can be chosen so that its fracture toughness is high, thus substantially preventing the crack from continued propagation, adding considerable product life. The term fracture toughness is well known by those with ordinary skill in the art and is therefore not defined herein.

Figure 8A:
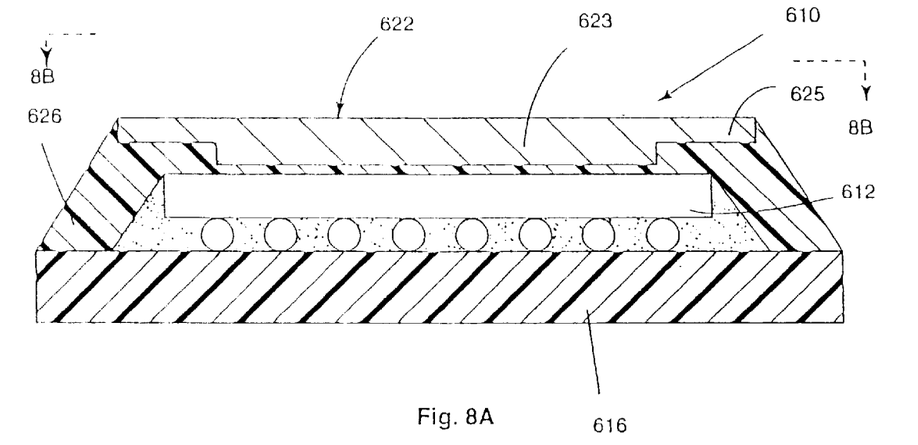
FIG. 8A is a sectional view, in elevation, of yet another embodiment of the electronic package of the present invention.
Figure 8B:
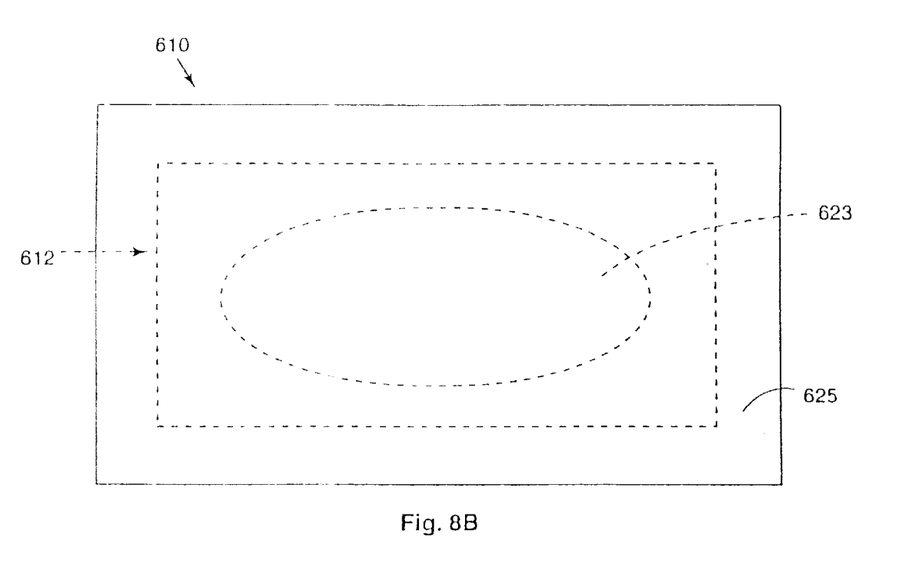
FIG. 8B is a top, plan view as taken along the line 8B—8B in FIG. 8A, illustrating the shape of the body portion of the thermally conductive member as being substantially oval, and the shape of the projecting portion of the thermally conductive member being substantially rectangular (the underlying substrate and dielectric material are not shown in this view.).
Figure 9A:
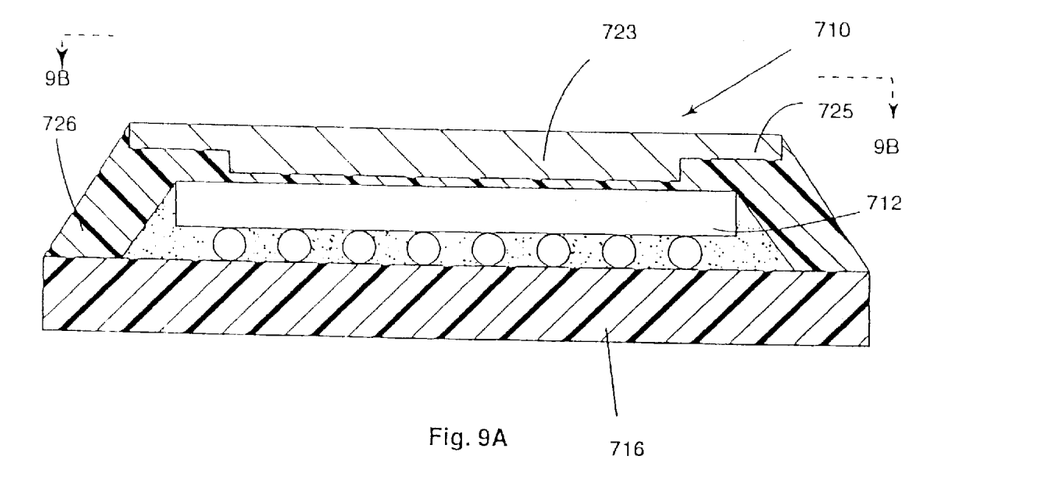
FIG. 9A is a sectional view, in elevation, of still yet another embodiment of the electronic package of the present invention.
Figure 9B:
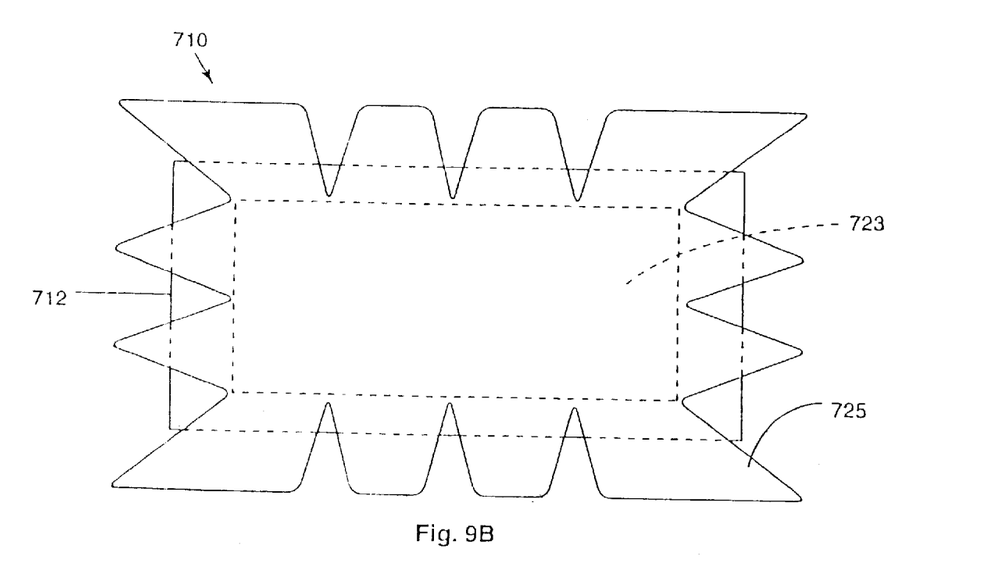
FIG. 9B is a top, plan view as taken along the line 9B—9B in FIG. 9A, illustrating the shape of the body portion of the thermally conductive member as being substantially rectangular, and the shape of projecting portion of the thermally conductive member being substantially a polygon (the underlying substrate and dielectric material are not shown in this view.).

FIGS. 8A and 8B illustrate yet another embodiment of an electronic package 610 of the present invention where the shape of the body portion 623 of thermally conductive member 622 is substantially oval and the shape of the projecting portion 625 is substantially rectangular. Other shapes of the body portion and projecting portion can be used in the present invention, including, substantially rectangular shapes with rounded corner radii or octagonal shaped areas. Still yet another embodiment of an electronic package 710 of the present invention with other shaped body and projecting portions is illustrated in FIGS. 9A and 9B. The shape of the body portion 723 is substantially rectangular and the shape of the projecting portion 725 is substantially polygonal.

Figure 10:
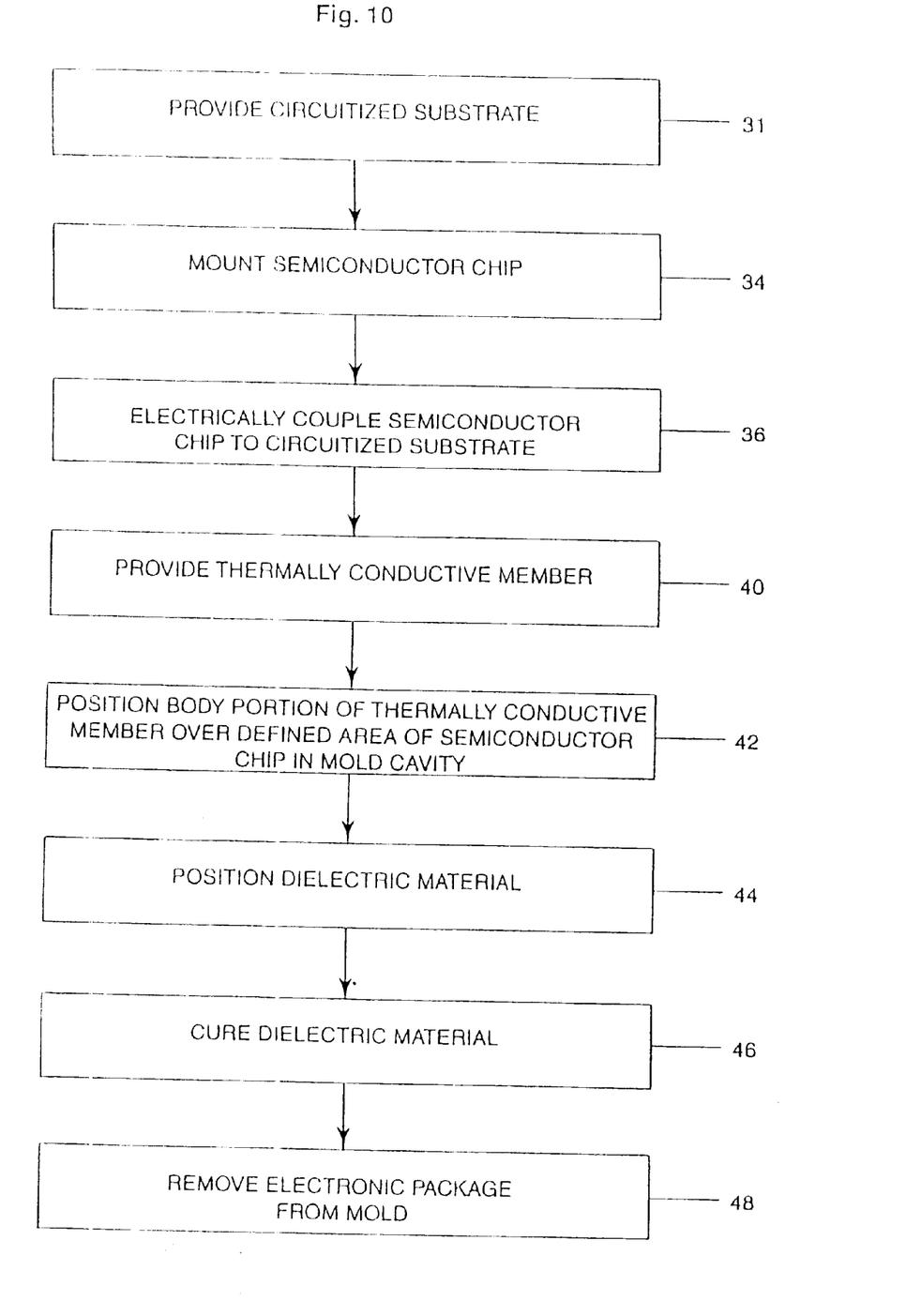
FIG. 10 is a flow diagram of the steps carried out in making an electronic package, in accordance with the method of the present invention.

FIG. 10 illustrates the various steps involved in making the electronic package of the present invention. A circuitized substrate, having an upper surface is provided, as depicted by Block 31. A chip is mounted on the upper surface of the circuitized substrate, as depicted in Block 34. As depicted by Block 36, the chip is electrically coupled to the circuitized substrate. The coupling is typically accomplished by a heating process in which solder interconnections or conductive interconnections are made. As described in detail above, the chip includes a substantially planar upper surface and at least a portion of an edge surface substantially perpendicular to the substantially planar upper surface, the planar upper surface having a defined area thereon.

Block 40 describes the step of providing a thermally conductive member having, as also described, upper and lower surfaces, at least one edge surface extending around a defined perimeter of the thermally conductive member, and further including a body portion and a projecting portion. The thermally conductive member can be formed by punching, drilling, coining, stamping, laser ablation, or by etching the appropriate sheet of material.

Block 42 describes the body portion of the thermally conductive member as being positioned substantially directly over the defined area of the planar upper surface of the chip, this body portion having a bending stiffness greater than the bending stiffness of the projecting portion. This is preferably accomplished by positioning and aligning the thermally conductive member, chip, and the circuitized substrate in a mold cavity (As shown in phantom in on FIG. 1.) wherein the thermally conductive member, held in the mold, preferably by vacuum (vacuum ports 43), combines with the mold cavity which is sealed against the substrate, forming a cavity so that, after molding, the lower surface of the thermally conductive member is in thermal communication with the planar upper surface of the chip. The lower surface of the thermally conductive member can be placed on the planar upper surface of the chip with thermally conductive material, or an adhesive. A small space may be left between the lower surface of the thermally conductive member and the planar upper surface of the chip without thermally conductive material present.

A dielectric material, such as a highly filled epoxy material is then positioned on at least a portion of the upper surface of the circuitized substrate and against the one edge surface of the thermally conductive member and against one edge surface of the chip. This step is represented by Block 44. The positioning step can be accomplished by dispensing or injecting the dielectric material into the mold cavity so that it substantially surrounds the at least one edge surface of the thermally conductive member, the at least one edge surface of the chip and is in intimate contact with the surrounding area of the upper surface of the circuitized substrate, thus essentially providing effective encapsulation of the chip and the thermally conductive member with the circuitized substrate. When positioning the thermally conductive member substantially directly over the defined area of the planar upper surface of the chip, as described above, a small space may be left between the lower surface of the thermally conductive member and the planar upper surface of the chip. Injecting the dielectric material into the mold cavity will then allow a thin layer of dielectric material to be forced on the planar upper surface of the chip and fill the space (as in FIGS. 1–9). Thermal communication can then occur through this thin layer of dielectric material. A significant advantage is obtained by practicing the invention in this manner, eliminating the separate step of attaching the thermally conductive member with a thermally conductive material or adhesive having a composition different than that of the dielectric material and thus eliminating the tendency of a material of a different composition to interfacially delaminate.

The dielectric material is then cured to make the dielectric material substantially rigid, as represented by Block 46.

After curing the dielectric material, the substantially rigid dielectric material covers the bottom surface of thermally conductive member, the chip, and the portion of the upper surface of the circuitized substrate, providing an integral, essentially inseparable, electronic package 10. After curing, the electronic package is removed from the mold, as indicated at block 48.

In summary, the defined package arrangement and method of forming same provides an electronic package that is reliable in performance, because it substantially reduces interfacial stresses, and is relatively easy to manufacture. These objectives are accomplished by using a mold technique to encapsulate the chip, along with a thermally conductive member, which includes a body portion and a projecting portion, the projecting portion having a bending stiffness less than that of the body portion, and that is used as an insert during the molding. The thermally conductive member may be attached to the planar upper surface of the chip by use of a small amount of a thermally conductive adhesive material, or a thin layer of dielectric material which may be thicker around the chip's periphery in order to further reduce the interfacial stresses. The thermally conductive member may be stamped from sheets of varying thicknesses at very low cost.

The thermal performance of the electronic package of the present invention, preferably, without an adhesive layer, but with a thin layer of substantially rigid dielectric material, between the planar upper surface and the thermally conductive member, will be substantially similar to that of a capped chip, using thermal grease. The present invention has the advantage of avoiding any possibility of pumping which may deplete the grease layer and increase the thermal resistance, as may occur with capped chips. The performance of the electronic package of the present invention is significantly better than that of a typical package which uses overmold without a thermally conductive member. Importantly, undesirable bending of the electronic package is significantly reduced as a result of balancing the expansion of the circuitized substrate and the thermally conductive member, providing high reliability and improved coplanarity, particularly when embodied in a Ball Grid Array (BGA) package as described hereinabove. Significantly, the present invention reduces the interfacial stresses that exist between the lower surface of the thermally conductive member (cover or cap) and the upper planar surface of the chip due to the mismatch between the CTE of the circuitized substrate, upon which the chip is mounted, and the chip. Delamination, near the corners and edges of the chip, and crack propagation, which can result from these interfacial stresses, is therefore substantially prevented or, at a minimum, significantly reduced during the manufacturing process and/or during thermal cycling (chip operation in the field). Reduced defect levels in manufacturing and improvements in field life performance are thus possible using the teachings herein.

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic package, comprising:

a circuitized substrate having an upper surface;

a semiconductor chip mounted on said upper surface of said circuitized substrate and electrically coupled to said substrate, said semiconductor chip having a substantially planar upper surface and at least one edge surface being substantially perpendicular to said substantially planar upper surface, said planar upper surface of said semiconductor chip having a defined area thereon, said defined area of said planar upper surface being less than the entirety of said planar upper surface of said semiconductor chip;

a thermally conductive member having upper and lower surfaces, said lower surface of said thermally conductive member thermally coupled to said substantially planar upper surface of said semiconductor chip, said thermally conductive member further having at least one edge surface extending around a defined perimeter of said thermally conductive member, said thermally conductive member further including a body portion and a projecting portion, said projecting portion of said thermally conductive member including a first plurality of openings and/or recesses therein and said body portion including a second plurality of openings and/or recesses therein, wherein each of said first plurality of openings and/or recesses include a first cross sectional area and each of said second plurality of openings and/or recesses include a second cross sectional area, said first cross sectional area of each of said first plurality of openings and/or recesses being greater than said second cross sectional area of each of said second plurality of openings and/or recesses, said projecting portion of said thermally conductive member substantially surrounding said body portion of said thermally conductive member, said body portion located substantially directly over said defined area of said planar upper surface of said semiconductor chip and having a bending stiffness greater than the bending stiffiness of said projecting portion; and a substantially rigid dielectric material positioned on at least a portion of said upper surface of said circuitized substrate and extending along at least a portion of said at least one edge surface of said thermally conductive member and extending along at least a portion of said at least one edge surface of said semiconductor chip.

2. The electronic package, as set forth in claim 1, wherein said defined area of said planar upper surface of said semiconductor chip is about 90% of the entirety of said planar upper surface of said semiconductor chip.

3. The electronic package, as set forth in claim 1, wherein said body portion of said thermally conductive member includes a first thickness and said projecting portion of said thermally conductive member includes a second thickness, said first thickness of said body portion being greater than said second thickness of said projecting portion.

4. The electronic package, as set forth in claim 1, wherein said body portion of said thermally conductive member includes a first thickness and said projecting portion of said thermally conductive member includes a second thickness, said second thickness of said projecting portion of said thermally conductive member being variable.

5. The electronic package, as set forth in claim 1, wherein said projecting portion of said thermally conductive member includes a plurality of pin portions or flange portions extending from said projecting portion.

6. The electronic package, as set forth in claim 1, wherein said plurality of pin portions or said flange portions are positioned in said substantially rigid dielectric material.

7. The electronic package, as set forth in claim 1, wherein said thermally conductive member comprises a material selected from the group consisting of copper, beryllium copper, copper alloys, steel, steel alloys, aluminum, aluminum alloys, ceramics, silicon, sintered metal, and wintered metal/ceramic materials.

8. The electronic package, as set forth in claim 1, wherein the shape of said body portion of said thermally conductive member is substantially oval, and the shape of said projecting portion of said thermally conductive member is substantially rectangular.

* * * * *